United States Patent
Pham et al.

(10) Patent No.: US 9,758,852 B2
(45) Date of Patent: *Sep. 12, 2017

(54) AMORPHOUS ALLOY SEAL

(75) Inventors: Quoc Tran Pham, Anaheim, CA (US); Theodore Andy Waniuk, Lake Forest, CA (US)

(73) Assignee: Crucible Intellectual Property, LLC, Rancho Santa Margarita, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/984,433

(22) Filed: Jan. 4, 2011

(65) Prior Publication Data

US 2011/0163509 A1 Jul. 7, 2011

Related U.S. Application Data

(60) Provisional application No. 61/335,294, filed on Jan. 4, 2010.

(51) Int. Cl.
| | | |
|---|---|---|
| *F16J 15/08* | (2006.01) | |
| *C22C 45/00* | (2006.01) | |
| *C22C 45/10* | (2006.01) | |
| *H01B 17/30* | (2006.01) | |
| *B23K 13/01* | (2006.01) | |
| *B23K 20/02* | (2006.01) | |
| *B23K 20/16* | (2006.01) | |

(Continued)

(52) U.S. Cl.
CPC .............. *C22C 45/00* (2013.01); *B23K 13/01* (2013.01); *B23K 20/02* (2013.01); *B23K 20/16* (2013.01); *B23K 20/22* (2013.01); *B23K 26/206* (2013.01); *B23K 26/211* (2015.10); *B23K 26/32* (2013.01); *C22C 30/00* (2013.01); *C22C 45/001* (2013.01); *C22C 45/003* (2013.01); *C22C 45/10* (2013.01); *F16J 15/0806* (2013.01); *H01L 21/50* (2013.01); *H01L 23/10* (2013.01); *H01B 17/305* (2013.01); *H01L 2924/0002* (2013.01); *H01L 2924/01079* (2013.01); *Y10T 428/13* (2015.01); *Y10T 428/24612* (2015.01); *Y10T 428/31678* (2015.04)

(58) Field of Classification Search
CPC ...... F16J 15/022; F16J 15/0806; F16J 15/102; H01B 17/305; H01B 17/306
USPC ................................ 277/637, 641, 642, 650
See application file for complete search history.

(56) References Cited

U.S. PATENT DOCUMENTS

| | | | | |
|---|---|---|---|---|
| 4,352,951 A | * | 10/1982 | Kyle | ..................... 174/152 GM |
| 4,371,588 A | * | 2/1983 | Kyle | ............................. 428/448 |

(Continued)

FOREIGN PATENT DOCUMENTS

| | | |
|---|---|---|
| DE | 3133599 A1 | 3/1983 |
| EP | 0723031 A2 | 7/1996 |

(Continued)

OTHER PUBLICATIONS

Inoue et al., Appl. Phys. Lett., vol. 71, p. 464, 1997.

(Continued)

*Primary Examiner* — Nicholas L Foster
(74) *Attorney, Agent, or Firm* — Brownstein Hyatt Farber Schreck, LLP

(57) ABSTRACT

Provided in one embodiment is an article, comprising a first part having a first surface and a hermetic seal disposed over a portion of the first surface, wherein the hermetic seal comprises a composition that is at least partially amorphous.

21 Claims, 7 Drawing Sheets

(51) Int. Cl.
*B23K 20/22* (2006.01)
*B23K 26/32* (2014.01)
*C22C 30/00* (2006.01)
*H01L 21/50* (2006.01)
*H01L 23/10* (2006.01)
*B23K 26/211* (2014.01)
*B23K 26/20* (2014.01)

(56) References Cited

U.S. PATENT DOCUMENTS

| | | | | |
|---|---|---|---|---|
| 4,512,791 | A * | 4/1985 | Kyle | 65/21.1 |
| 4,562,951 | A | 1/1986 | Cytron | |
| 4,621,031 | A | 11/1986 | Scruggs | |
| 4,626,002 | A * | 12/1986 | Hagemeister et al. | 285/95 |
| 4,665,294 | A | 5/1987 | Hira et al. | |
| 5,188,990 | A | 2/1993 | Dumesnil et al. | |
| 5,288,344 | A | 2/1994 | Peker et al. | |
| 5,368,659 | A | 11/1994 | Peker et al. | |
| 5,482,580 | A | 1/1996 | Scruggs et al. | |
| 5,618,359 | A | 4/1997 | Lin et al. | |
| 5,735,975 | A | 4/1998 | Lin et al. | |
| 5,896,642 | A | 4/1999 | Peker et al. | |
| 6,325,868 | B1 | 12/2001 | Kim et al. | |
| 6,357,763 | B2 * | 3/2002 | Mathew et al. | 277/628 |
| 6,692,590 | B2 * | 2/2004 | Xing et al. | 148/561 |
| 6,818,078 | B2 * | 11/2004 | Kim | C22C 45/10 148/403 |
| 8,032,194 | B2 * | 10/2011 | Liu et al. | 455/575.8 |
| 8,335,050 | B2 * | 12/2012 | Kavosh | G11B 33/1446 360/97.12 |
| 9,027,630 | B2 * | 5/2015 | Prest | B23K 31/02 164/100 |
| 9,057,120 | B2 * | 6/2015 | Pham | C22C 1/002 |
| 2002/0132131 | A1 * | 9/2002 | Bossmann et al. | 428/615 |
| 2003/0062811 | A1 * | 4/2003 | Peker et al. | 312/223.1 |
| 2003/0164209 | A1 * | 9/2003 | Poon et al. | 148/561 |
| 2003/0222122 | A1 * | 12/2003 | Johnson | B22D 11/001 228/101 |
| 2005/0194174 | A1 * | 9/2005 | Hipwell et al. | 174/61 |
| 2006/0063059 | A1 * | 3/2006 | Lewinsohn et al. | 429/36 |
| 2006/0157164 | A1 * | 7/2006 | Johnson | C22C 45/003 148/403 |
| 2007/0003812 | A1 * | 1/2007 | Wende | 429/38 |
| 2007/0048887 | A1 | 3/2007 | Erlach et al. | |
| 2007/0217163 | A1 * | 9/2007 | Greatbatch et al. | 361/719 |
| 2007/0226979 | A1 * | 10/2007 | Paton et al. | 29/90.7 |
| 2008/0247082 | A1 * | 10/2008 | Kavosh | G11B 25/043 360/99.21 |
| 2008/0251164 | A1 | 10/2008 | Lohwongwatana et al. | |
| 2009/0079137 | A1 * | 3/2009 | Cross | 277/550 |
| 2010/0221484 | A1 * | 9/2010 | Meade | 428/66.7 |
| 2011/0162795 | A1 | 7/2011 | Pham et al. | |
| 2014/0011050 | A1 * | 1/2014 | Poole | C22C 1/002 428/686 |

FOREIGN PATENT DOCUMENTS

| | | |
|---|---|---|
| JP | H06063741 | 3/1994 |
| JP | H06063771 | 3/1994 |
| JP | H09317959 | 12/1997 |
| JP | 2001303218 A | 10/2001 |
| JP | 2006524896 | 11/2006 |
| JP | 2007000895 | 1/2007 |
| WO | 2009/070701 | 6/2009 |

OTHER PUBLICATIONS

Shen et al., Mater. Trans., JIM, vol. 42, p. 2136, 2001.
International Search Report in related application PCT/US2011/020132 mailed Mar. 21, 2011.
Japanese Office Action, Japanese Patent Application No. 2012-548073, mail date Dec. 24, 2013, total of 6 pages.
International Preliminary Report on Patentability (IPRP), mail date May 1, 2014.
Korean Intellectual Property Office, Korean Patent Application No. 10-2012-7020497, mail date Apr. 25, 2014.
State Intellectual Property Office of the People's Republic of China, Chinese Patent Application No. 201180011946.2, mail date Apr. 18, 2014.
Japanese Patent Office, Japanese Application No. JPA 2012-548073, Final rejection office action, disptach date Aug. 26, 2014.
Korean Intellectual Property Office, Korean Patent Application No. 10-2012-7020497, mail date Oct. 24, 2014.
Korean Intellectual Property Office, Korean Patent Application No. 10-2014-7017481, mail date Sep. 22, 2014.
Korean Office Action dated Nov. 5, 2015, KR 10-2012-7020497, 5 pages.
Korean Office Action dated Jun. 6, 2015, KR 10-2012-7020497, 3 pages.
European Examination Report dated Mar. 9, 2015, EP 11701166.8, 10 pages.
Korean Office Action dated Nov. 4, 2015, KR 10-2014-7017481, 4 pages.
Korean Office Action dated Jun. 6, 2015, KR 10-2014-7017481, 3 pages.

* cited by examiner

AMORPHOUS ALLOY SEAL

RELATED APPLICATION

This application claims priority from U.S. Provisional Application Ser. No. 61/335,294, filed Jan. 4, 2010, which is hereby incorporated herein by reference in its entirety. This application is related to U.S. patent application Ser. No. 12/984,433, filed Jan. 4, 2011, entitled "AMORPHOUS ALLOY SEAL" and U.S. patent application Ser. No. 12/984,440, filed Jan. 4, 2011 entitled "AMORPHOUS ALLOY BONDING," both of which are incorporated herein by reference in their entireties.

BACKGROUND

Bulk-solidifying amorphous alloys have been made in a variety of metal systems. They are generally prepared by quenching from above the melting temperature to the ambient temperature. Generally, high cooling rates such as one on the order of $10^{5\circ}$ C./sec, are needed to achieve an amorphous structure. The lowest rate by which a bulk solidifying alloy can be cooled to avoid crystallization, thereby achieving and maintaining the amorphous structure during cooling, is referred to as the "critical cooling rate" for the alloy In order to achieve a cooling rate higher than the critical cooling rate, heat has to be extracted from the sample. Thus, the thickness of articles made from amorphous alloys often becomes a limiting dimension, which is generally referred to as the "critical (casting) thickness." A critical casting thickness can be obtained by heat-flow calculations, taking into account the critical cooling rate.

Until the early nineties, the processability of amorphous alloys was quite limited, and amorphous alloys were readily available only in powder form or in very thin foils or strips with a critical casting thickness of less than 100 micrometers. A new class of amorphous alloys based mostly on Zr and Ti alloy systems was developed in the nineties, and since then more amorphous alloy systems based on different elements have been developed. These families of alloys have much lower critical cooling rates of less than $10^{3\circ}$ C./sec, and thus these articles have much larger critical casting thicknesses than their previous counterparts. However, little has been shown regarding how to utilize and/or shape these alloy systems into structural components, such as those of consumer electronic devices. Thus, a need exists to develop methods of utilizing amorphous alloys and shaping them into structural components.

SUMMARY

Provided herein include methods of forming an interfacial layer or seal having amorphous alloys or composites within the supercooled liquid region or around the glass transition temperature of the amorphous alloys. Also provided herein include articles that comprise an interfacial layer made of, or having, the amorphous alloys or composites, the interfacial layer being used as an bonding element to bond at least two parts. Another embodiment provides a seal made of, or having, the amorphous alloys or composites, the seal being used to create an effectively air-tight and/or water-proof seal over a part. The seal can be over the surface of the part on the exterior surface and/or interior surface, particularly when the surface has a recessed surface, such as a cavity or undercut.

In one embodiment, a method of forming an interfacial layer is provided, the method comprising: providing a first part comprising a first surface and a second part comprising a second surface; providing a composition that is at least partially amorphous, the composition having a glass transition temperature Tg and a crystallization temperature Tx; heating the composition to a first temperature that is below Tx; disposing the heated composition onto a portion of the first surface and a portion of the second surface to form an interfacial layer therebetween; and cooling the interfacial layer to a second temperature that is below Tg, wherein the interfacial layer forms an intimate contact with at least one of the first surface and the second surface.

In another embodiment, a method of joining two surfaces is provided, the method comprising: disposing a heated composition onto a portion of a first surface of a first part and a portion of a second surface of a second part to form therebetween an interfacial layer; wherein the composition is at least partially amorphous and has a glass transition temperature Tg and a crystallization temperature Tx, and wherein the heated composition is at a first temperature below Tx; and cooling the interfacial layer to a second temperature that is below Tg, wherein the interfacial layer forms an intimate contact with at least one of the first surface and the second surface.

In another embodiment, a method of forming an interfacial layer between two surfaces is provided, the method comprising: providing an alloy feedstock; heating the feedstock to a first temperature above a melting temperature Tm of the feedstock; quenching the heated feedstock to a second temperature below a glass transition temperature Tg of the feedstock to form a composition of the alloy, which composition is at least partially amorphous; heating the composition to a third temperature that is below a crystallization temperature Tx of the composition; disposing the heated composition onto a portion of a first surface of a first part and a portion of a second surface of a second part to form an interfacial layer therebetween; and cooling the interfacial layer to a fourth temperature that is below Tg, wherein the interfacial layer forms an intimate contact with at least one of the first surface and the second surface.

One embodiment provides a method of forming a seal, the method comprising: providing a composition that is at least partially amorphous, the composition having a glass transition temperature Tg and a crystallization temperature Tx; providing a first part comprising a first recessed surface; heating the composition to a first temperature that is below Tx; disposing the heated composition onto a portion of the first recessed surface to form a seal thereover; cooling the seal to a second temperature that is below Tg.

An alternative embodiment provides a method of forming a seal, the method comprising: providing a first part having a first surface and a second part having a second surface, wherein at least one of the first surface and the second surface comprise a recessed surface; providing a composition that is at least partially amorphous, which composition has a glass transition temperature Tg and a crystallization temperature Tx; heating the composition to a first temperature that is below Tx; disposing the heated composition onto a portion of the first surface and a portion of the second surface to form a seal that is in contact with the first surface and second surface; and cooling the seal to a second temperature that is below Tg.

Another embodiment provides a method of forming a seal between to two parts, the method comprising: disposing a heated composition into a cavity of a first part, the cavity having a first surface, to form a seal that is in contact with a portion of the first surface and a portion of a second surface of a second part located in a space in the cavity; wherein the composition is at least partially amorphous and has a glass transition temperature Tg and a crystallization temperature Tx; and wherein at least one of (i) the composition, (ii) the first part, and (iii) the second part is heated to a first temperature that is below Tx; and cooling the seal to a second temperature that is below Tg.

Provided herein is one embodiment is an article, comprising a first part having a first surface and a hermetic seal disposed over a portion of the first surface, wherein the hermetic seal comprises a composition that is at least partially amorphous.

Provided herein is an alternative embodiment is an article, comprising a first part comprising having a cavity having a first surface; a second part at least partially located in a space in the cavity, the second part having a second surface at its exterior; and a hermetic seal in contact with a portion of the first surface and a portion of the second surface.

Provided herein is another embodiment is an article, comprising a first part having a first recessed surface and a hermetic seal disposed over the first surface, wherein the hermetic seal is formed by the method comprising: providing a composition that is at least partially amorphous, the composition having a glass transition temperature Tg and a crystallization temperature Tx; providing the first part comprising at least the first recessed surface; heating the composition to a first temperature that is below Tx; disposing the heated composition onto a portion of the first recessed surface to form a sealing layer thereon; cooling the sealing layer to a second temperature that is below Tg to form a hermetic seal over the first part.

BRIEF DESCRIPTION OF THE DRAWINGS

FIGS. 5(a)-5(b) are similar to the process shown in FIGS. 2(a)-2(b). FIGS. 5(c)-5(d) provide shows the formation of a second interfacial layer and its relationship to the two parts and the first interfacial layer in two embodiments.

DETAILED DESCRIPTION

Figure 1:
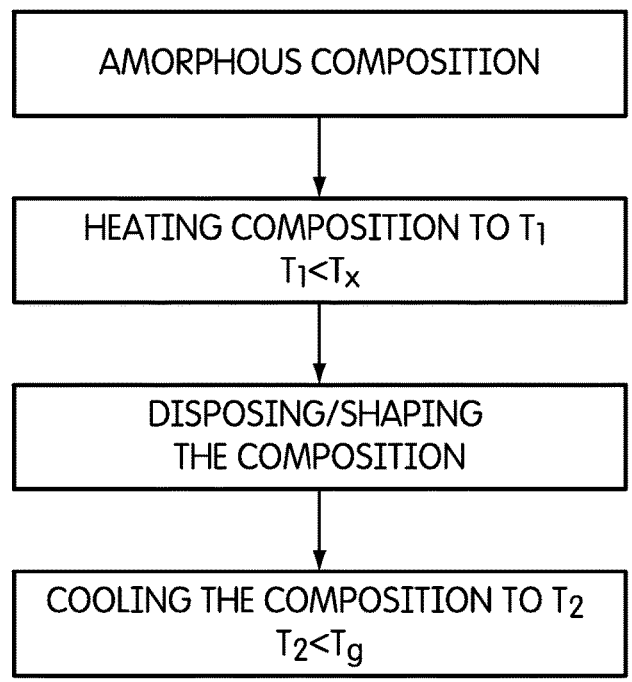
FIG. 1 provides an illustrative flow diagram showing the process of forming an interfacial layer/seal in one embodiment.

Below are several embodiments that were presented as claims in the priority Provisional Application Ser. No. 61/335,294, which are incorporated herein in their entirety by references:

A method to form a hermetic seal using amorphous alloy or composite containing amorphous alloy where the forming process takes place at a temperature around the glass transition temperature or within the supercooled liquid region.

A method of the above embodiment, wherein amorphous stock material can be in the form of layers, shot, sheets, or any other shape. Multiple layers, shot(s), sheet(s), part(s) can be used simultaneously.

A method of the above embodiment, wherein the amorphous alloy is described by the following molecular formula: $(Zr, Ti)_a(Ni, Cu, Fe)_b(Be, Al, Si, B)_c$, wherein "a" is in the range of from 30 to 75, "b" is in the range of from 5 to 60, and "c" is in the range of from 0 to 50 in atomic percentages.

A method of the above embodiment, wherein the amorphous alloy is described by the following molecular formula: $(Zr, Ti)_a(Ni, Cu)_b(Be)_c$, wherein "a" is in the range of from 40 to 75, "b" is in the range of from 5 to 50, and "c" is in the range of from 5 to 50 in atomic percentages.

A method of the above embodiment, wherein the amorphous alloy is platinum-based.

A method of the above embodiment, wherein the amorphous alloy is palladium-based.

A method of the above embodiment, wherein the amorphous alloy is gold-based.

A method of the above embodiment, wherein the amorphous alloy is silver-based.

A method of the above embodiment, wherein the amorphous alloy or composite containing amorphous alloy can sustain strains up to 1.5% or more without any permanent deformation or breakage.

A method of forming a hermetic seal using amorphous alloy or composite containing amorphous alloy, comprising the steps of:

providing a feedstock of amorphous alloy being substantially amorphous or composite containing amorphous alloy;

heating the feedstock, the mold, and/or the part, and the forming tool to around the glass transition temperature or within the supercooled liquid region;

shaping the heated feedstock into the mold and/or another part(s) to form the desired shape, bond and seal;

cooling the formed part to temperatures far below the glass transition temperature, and shaping or forming includes but is not limit to conforming, shearing, extrusion, and over-molding.

A method of forming and separating of bulk solidifying amorphous alloy or composite containing amorphous alloy, comprising the steps of:

providing a homogeneous alloy feedstock of amorphous alloy or composite containing amorphous alloy (not necessarily fully amorphous);

heating the feedstock to a casting temperature above the melting temperatures; i introducing the molten alloy into a first mold with critical casting thickness or thinner; and quenching the molten alloy to temperatures below glass transition.

heating the feedstock, the second mold, and the forming tool to around the glass transition temperature or within the supercooled liquid region;

shaping the heated feedstock into the second mold and/or another part to form a desired shape bond and seal;

cooling the formed part to temperatures far below the glass transition temperature. the part may have thickness thicker than the critical casting thickness; and shaping or forming includes but not limit to conforming, shearing, extrusion, and over-molding.

A method of forming a hermetic seal wherein the final part's dimensions exceed the critical casting thickness of the bulk solidifying amorphous alloys.

A method of forming a hermetic seal wherein forming and separating can be performed in any order or exclusively.

A method of forming a hermetic seal wherein the bulk-solidifying amorphous alloy or composite containing amorphous alloy, the mold, and/or another part, and the forming tool are at temperature around the glass transition temperature or in the supercooled liquid region.

A method of forming a hermetic seal wherein the bulk-solidifying amorphous alloy or composite containing amorphous alloy, the mold, and/or another part(s), and the cutting tool are at a temperature around the glass transition temperature or within the supercooled liquid region. The amorphous alloy or composite containing amorphous alloy is connected to at least one of the surfaces.

A method of forming a hermetic seal wherein the amorphous alloy or composite containing amorphous alloy is heated locally, where the forming or trim cut is performed, to a temperature around the glass transition temperature or in the supercooled liquid region, and the amorphous alloy or composite containing amorphous alloy can be at any temperature.

A method of forming a hermetic seal wherein the amorphous alloy or composite containing amorphous alloy is heated locally, where the forming trim cut is performed, to the cutting temperature around the glass transition temperature or in the supercooled liquid region, and the amorphous alloy or composite containing amorphous alloy can be at any temperature. A heated plate which is at the cutting temperature is used as a cutting tool.

A method of forming a hermetic seal wherein the amorphous alloy or composite containing amorphous alloy, in the supercooled liquid region, is pushed into a mold cavity or between part(s) and/or the mold also heated to within the supercooled liquid region.

A method of forming a hermetic seal wherein the amorphous alloy or composite containing amorphous alloy, in the supercooled liquid region, is extruding into or through a mold, part(s) and/or between, also heated to within the supercooled liquid region.

A method of forming a hermetic seal wherein the amorphous alloy or composite containing amorphous alloy, in the supercooled liquid region, is pushed into a mold cavity or another part, also heated to within the supercooled liquid region.

A method of forming a hermetic seal wherein the amorphous alloy or composite containing amorphous alloy, in the supercooled liquid region, is over-mold into a mold cavity or another part, also heated to within the supercooled liquid region.

A method of forming a hermetic seal wherein the amorphous alloy or composite containing amorphous alloy, in the supercooled liquid region, is pushed into a mold cavity or between part(s) and/or the mold, which is heated to below the supercooled liquid region.

A method of forming a hermetic seal wherein the amorphous alloy or composite containing amorphous alloy, in the supercooled liquid region, is extruded into or through a mold or part(s) and/or between, which is heated to below the supercooled liquid region.

A method of forming a hermetic seal wherein the amorphous alloy or composite containing amorphous alloy, in the supercooled liquid region, is pushed into a mold cavity or between part(s) and/or the mold or another part, which is heated to below the supercooled liquid region.

A method of forming a hermetic seal wherein the amorphous alloy or composite containing amorphous alloy, in the supercooled liquid region, is over-mold into a mold cavity or between part(s) and/or the mold or another part, which is heated to below the supercooled liquid region.

A method of forming a hermetic seal wherein the bulk amorphous alloy or composite containing amorphous alloy is heated by a laser, a resistance furnace or alike, electrical arc or alike, or inductively.

A method of forming a hermetic seal wherein the provided bulk solidifying amorphous alloy composition is Zr/Ti-based.

A method of forming a hermetic seal wherein the provided bulk solidifying amorphous alloy composition is Zr-based.

A method of forming a hermetic seal wherein the provided bulk solidifying amorphous alloy composition is Zr/Ti-based with no Ni.

A method of forming a hermetic seal wherein the provided bulk solidifying amorphous alloy composition is Zr/Ti base with no Al.

A method of forming a hermetic seal wherein the provided bulk solidifying amorphous alloy composition is Zr/Ti-based with no Be.

A method of forming a hermetic seal wherein the provided bulk solidifying amorphous alloy composition is platinum-based.

A method of forming a hermetic seal wherein the provided bulk solidifying amorphous alloy composition is palladium-based.

34. A method of forming a hermetic seal wherein the provided bulk solidifying amorphous alloy composition is gold-based.

A method of forming a hermetic seal wherein the provided bulk solidifying amorphous alloy composition is silver-based.

A method of forming and separation wherein the provided bulk solidifying amorphous alloy composition is Cu-based.

A method of forming and separation wherein the provided bulk solidifying amorphous alloy composition is Fe-based.

A method of forming a hermetic seal wherein the bulk-solidifying amorphous alloy or composite containing amorphous alloy is formed under vacuum.

A method of forming a hermetic seal wherein the bulk-solidifying amorphous alloy or composite containing amorphous alloy is formed under inert atmosphere.

A method of forming a hermetic seal wherein the bulk-solidifying amorphous alloy or composite containing amorphous alloy is formed under partial vacuum.

A method of forming a hermetic seal wherein the bulk-solidifying amorphous alloy or composite containing amorphous alloy can be formed one or more times.

A method of forming and separation wherein the final part has thickness that can be thicker than the critical casting thickness of the alloy.

A method of forming a hermetic seal wherein the bulk amorphous alloy or composite containing amorphous alloy is cooled to temperatures below the glass transition temperature, under pressure.

A method of forming a hermetic seal wherein the seal is made of amorphous alloy or composite containing amorphous alloy.

A method of forming a hermetic seal where in the seal can be used as a conductor.

A method of forming a hermetic seal wherein the mold, separating tools, the part(s) can also be made of amorphous alloy or composite containing amorphous alloy.

The articles "a" and "an" are used herein to refer to one or to more than one (i.e. to at least one) of the grammatical object of the article. By way of example, "a polymer resin" means one polymer resin or more than one polymer resin. The term "substantially" is used in conjunction with another term to describe a particular characteristic of the embodiments disclosed herein. Any ranges cited herein are inclusive. In determining the range encompassed by the term "about," one must consider the context of the term as it is used in application. For example, the term can refer to less than or equal to ±10%, such as less than or equal to ±5%, such as less than or equal to ±2%, such as less than or equal to ±1%, such as less than or equal to ±0.5%, such as less than or equal to ±10.2%, such as less than or equal to ±10.1%, such as less than or equal to ±10.05%.

Amorphous Alloy

An amorphous or non-crystalline solid is a solid that lacks lattice periodicity, which is characteristic of a crystal. As used herein, an "amorphous solid" includes "glass" which is an amorphous solid that exhibits a glass transition during heating from low temperature to the liquid state. Other types of amorphous solids include gels, thin films, and nanostructured materials. Generally, amorphous materials have lack the long-range order characteristic of a crystal though they possess some short-range order at the atomic length scale due the nature of chemical bonding. The distinction between amorphous solids and crystalline solids can be made based on lattice periodicity that can determined by structural characterization techniques such as x-ray diffraction and transmission electron microscopy.

The terms order and disorder designate the presence or absence of some symmetry or correlation in a many-particle system. The terms "long-range order" and "short-range order" distinguish order in materials based on length scales.

The strictest form of order in a solid is lattice periodicity: a certain pattern (the arrangement of atoms in a unit cell) is repeated again and again to form a translationally invariant tiling of space. This is the defining property of a crystal. Possible symmetries have been classified in 14 Bravais lattices and 230 space groups.

Lattice periodicity implies long-range order. If only one unit cell is known, then by virtue of the translational symmetry it is possible to accurately predict all atomic positions at arbitary distances. The converse is generally true except, for example, in quasicrystals that have perfectly deterministic tilings but do not possess lattice peridocity.

Long-range order characterizes physical systems in which remote portions of the same sample exhibit correlated behavior.

This can be expressed as a correlation function, namely the spin-spin correlation function: $G(x, x') = \langle s(x), s(x') \rangle$.

In the above function, s is the spin quantum number and x is the distance function within the particular system.

This function is equal to unity when $x=x'$ and decreases as the distance $|x-x'|$ increases. Typically, it decays exponentially to zero at large distances, and the system is considered to be disordered. If, however, the correlation function decays to a constant value at large $|x-x'|$ then the system is said to possess long-range order. If it decays to zero as a power of the distance then it is called quasi-long-range order. Note that what constitutes a large value of $|x-x'|$ is relative.

A system is said to present quenched disorder when some parameters defining its behavior are random variables which do not evolve with time, i.e., they are quenched or frozen, for example, spin glasses. It is opposite to annealed disorder, where the random variables are allowed to evolve themselves. Embodiments herein include systems comprising quenched disorder.

An amorphous metal is an amorphous metallic material with a disordered atomic-scale structure. In contrast to most metals, which are crystalline and therefore have a highly ordered arrangement of atoms, amorphous alloys are non-crystalline. Materials in which such a disordered structure is produced directly from the liquid state during cooling are called "glasses", and so amorphous metals are commonly referred to as "metallic glasses" or "glassy metals". However, there are several ways besides extremely rapid cooling in which amorphous metals can be produced, including physical vapor deposition, solid-state reaction, ion irradiation, and mechanical alloying. Amorphous alloys are a single class of materials, regardless of how they are prepared.

Amorphous metals can be produced through a variety of quick-cooling methods. For instance, amorphous metal can be produced by spraying or injecting molten metal onto a spinning metal disk. The rapid cooling, on the order of millions of degrees a second, is too fast for crystals to form and the material is "locked in" a glassy state. Also, amorphous metals can be produced with critical cooling rates low enough to allow formation of amorphous structure in thick layers (over 1 millimeter); these are known as bulk metallic glasses (BMG).

Amorphous metal can be an alloy rather than a pure metal. The alloys may contain atoms of significantly different sizes, leading to low free volume (and therefore up to orders of magnitude higher viscosity than other metals and alloys) in the molten state. The viscosity prevents the atoms from moving enough to form an ordered lattice. Such a material structure may result in low shrinkage during cooling and resistance to plastic deformation. An absence of grain boundaries, the weak spots of crystalline materials, may lead to better resistance to wear and corrosion. Amorphous metals, while technically glasses, may also be much tougher and less brittle than oxide glasses and ceramics.

The thermal conductivity of amorphous materials may be lower than of crystals. To achieve the formation of an amorphous structure even during slower cooling, the alloy may be made of three or more components, leading to complex crystal units with higher potential energy and lower chance of formation. The formation of amorphous alloy depends on several factors: the composition of the components of the alloy; the atomic radius of the components has to be significantly different (over 12%), to achieve high packing density and low free volume; the combination of components should have negative heat of mixing, inhibiting crystal nucleation and prolonging the time the molten metal stays in supercooled state. However, as the formation of an amorphous alloy is based on many different variables, it is almost impossible to make a prior determination of whether an alloy composition would form an amorphous alloy.

Amorphous alloys, for example, of boron, silicon, phosphorus, and other glass formers with magnetic metals (iron, cobalt, nickel) may be magnetic, with low coercivity and high electrical resistance. The high resistance leads to low losses by eddy currents when subjected to alternating magnetic fields, a property useful for example as transformer magnetic cores.

Amorphous alloys may have a variety of potentially useful properties. In particular, they tend to be stronger than crystalline alloys of similar chemical composition, and they can sustain larger reversible ("elastic") deformations than crystalline alloys. Amorphous metals derive their strength directly from their non-crystalline structure, which does not have any of the defects (such as dislocations) that limit the strength of crystalline alloys. One modern amorphous metal, known as Vitreloy, has a tensile strength that is almost twice that of high-grade titanium. However, metallic glasses at room temperature have poor or no ductility when loaded in tension. Therefore, there is considerable interest in producing metal matrix composite materials consisting of a metallic glass matrix containing dendritic particles or fibers of a ductile crystalline metal to improve ductility.

Another useful property of bulk amorphous alloys is that they are true glasses, which means that they soften and flow upon heating. This allows for easy processing, for example by injection molding, using techniques similar to those used for polymers. As a result, amorphous alloys can be used for making sports equipment, medical devices, electronic component and equipment, and thin films. Thin films of amorphous metals can be deposited via the high velocity oxygen fuel technique as protective coatings.

The term "amorphous" can also be used together with the term "phase," as in describing a material or composition of an amorphous phase or having an amorphous phase—the term "phase" can refer to one that can be found in a thermodynamic phase diagram. A phase is a region of space (a thermodynamic system) throughout which all physical properties of a material are essentially uniform. Examples of physical properties include density, index of refraction, chemical composition and lattice periodicity. A simple description is that a phase is a region of material that is chemically uniform, physically distinct, and (often) mechanically separable. In a system consisting of ice and water in a glass jar, the ice cubes are one phase, the water is a second phase, and the humid air over the water is a third phase. The glass of the jar is another separate phase.

An amorphous metal or amorphous alloy can refer to a metal-element-containing material exhibiting only a short range order—the term "element" throughout this application refers to the element found in a Periodic Table. Because of the short-range order, an amorphous material can sometimes be described as "glassy." Thus, as explained above, an amorphous metal or alloy can sometimes be referred to as "metallic glass," or "Bulk Metallic Glass" (BMG).

A material can have an amorphous phase, a crystalline phase, or both. The amorphous and crystalline phases can have the same chemical composition and differ only in the microstructure—i.e., one amorphous and the other crystalline. Microstructure is defined as the structure of a material as revealed by a microscope at 25× magnification. Alternatively, the two phases can have different chemical compositions and microstructure. For example, a composition can be partially amorphous, substantially amorphous, or completely amorphous. A partially amorphous composition can refer to a composition at least about 5 vol % of which is of an amorphous phase, such as at least about 10 wt %, such as at least 20 vol %, such as at least about 40 vol %, such as at least about 60 vol %, such as at least about 80 vol %, such at least about 90 vol %. The terms "substantially" and "about" have been defined elsewhere in this application. Accordingly, a composition that is at least substantially amorphous can refer to one of which at least about 90 vol % is amorphous, such as at least about 95 vol %, such as at least about 98 vol %, such as at least about 99 vol %, such as at least about 99.5 vol %, such as at least about 99.8 vol %, such as at least about 99.9 vol %. In one embodiment, a substantially amorphous composition can have some incidental, insignificant amount of crystalline phase present therein.

Disposing and Shaping

The term "disposing" refers to putting something in place such as to arrange or position something for use or for a particular purpose. The term "shaping" refers to giving a particular form or to cause to conform to a particular form or pattern.

In one embodiment, an amorphous alloy composition can be homogeneous with respect to the amorphous phase. A substance that is uniform in composition is homogeneous. This is in contrast to a substance that is heterogeneous. The term composition refers to the chemical composition and/or microstructure in the substance. A substance is homogeneous when a volume of the substance is divided in half and both halves have substantially the same composition. For example, a particulate suspension is homogeneous when a volume of the particulate suspension is divided in half and both halves have substantially the same volume of particles. However, it might be possible to see the individual particles under a microscope. Another homogeneous substance is air where different ingredients therein are equally suspended, though the particles, gases and liquids in air can be analyzed separately or separated from air.

A composition that is homogeneous with respect to an amorphous alloy can refer to one having an amorphous phase substantially uniformly distributed throughout its microstructure. In other words, the composition macroscopically comprises a substantially uniformly distributed amorphous alloy throughout the composition. In an alternative embodiment, the composition can be of a composite, having an amorphous phase having therein a non-amorphous phase. The non-amorphous phase can be a crystal or a plurality of crystals. The crystals can be in the form of particulates of any shape, such as spherical, ellipsoid, wire-like, rod-like, sheet-like, flake-like, or an irregular shape. In one embodiment, it can have a dendritic form. For example, an at least partially amorphous composite composition can have a crystalline phase in the shape of dendrites dispersed in an amorphous phase matrix; the dispersion can be uniform or non-uniform, and the amorphous phase and the crystalline phase can have the same or different chemical composition. In one embodiment, they have substantially the same chemical composition.

The methods described herein can be applicable to any type of amorphous alloys. Similarly, the amorphous alloys described herein as a constituent of a composition or article can be of any type. The amorphous alloy can comprise the element Zr, Hf, Ti, Cu, Ni, Pt, Pd, Fe, Mg, Au, La, Ag, Al, Mo, Nb, or combinations thereof. Namely, the alloy can include any combination of these elements in its chemical formula or chemical composition. The elements can be present at different weight or volume percent. For example, an iron "based" alloy can refer to an alloy having a non-significant weight percentage of iron present therein, the weight percent can, for example, at least about 10 wt %, such as at least about 20 wt %, such as at least about 40 wt %, such as at least 50 wt %, such as at least about 60 wt %. Alternatively, in one embodiment, the aforedescribed percentages can be volume percentages, instead of weight percentages. Accordingly, an amorphous alloy can be zirconium-based, titanium-based, platinum-based, palladium-based, gold-based, silver-based, copper-based, iron-based, nickel-based, aluminum-based, molybdenum-based, and the like. In some embodiments, the alloy, or the composition including the alloy, can be substantially free of nickel, aluminum, or beryllium, or combinations thereof. In one embodiment, the alloy or the composite is completely free of nickel, aluminum, or beryllium, or combinations thereof.

For example, the amorphous alloy can have the formula $(Zr, Ti)_a(Ni, Cu, Fe)_b(Be, Al, Si, B)_c$, wherein a, b, and c each represents a weight or atomic percentage. In one embodiment, a is in the range of from 30 to 75, b is in the range of from 5 to 60, and c is in the range of from 0 to 50 in atomic percentages. Alternatively, the amorphous alloy can have the formula $(Zr, Ti)_a(Ni, Cu)_b(Be)_c$, wherein a, b, and c each represents a weight or atomic percentage. In one embodiment, a is in the range of from 40 to 75, b is in the range of from 5 to 50, and c is in the range of from 5 to 50 in atomic percentages. The alloy can also have the formula $(Zr, Ti)_a(Ni, Cu)_b(Be)_c$, wherein a, b, and c each represents a weight or atomic percentage. In one embodiment, a is in the range of from 45 to 65, b is in the range of from 7.5 to 35, and c is in the range of from 10 to 37.5 in atomic percentages. Alternatively, the alloy can have the formula $(Zr)_a(Nb, Ti)_b(Ni, Cu)_c(Al)_d$, wherein a, b, c, and d each represents a weight or atomic percentage. In one embodiment, a is in the range of from 45 to 65, b is in the range of from 0 to 10, c is in the range of from 20 to 40 and d is in the range of from 7.5 to 15 in atomic percentages. One exemplary embodiment of the aforedescribed alloy system is a Zr—Ti—Ni—Cu—Be based amorphous alloy under the trade name Vitreloy, such as Vitreloy-1 and Vitreloy-101, as fabricated by Liquidmetal Technologies, CA, USA. Some examples of amorphous alloys of the different systems are provided in Table 1.

The amorphous alloys can also be ferrous alloys, such as (Fe, Ni, Co) based alloys. Examples of such compositions are disclosed in U.S. Pat. Nos. 6,325,868; 5,288,344; 5,368,659; 5,618,359; and 5,735,975, Inoue et al., Appl. Phys. Lett., Volume 71, p 464 (1997), Shen et al., Mater. Trans., JIM, Volume 42, p 2136 (2001), and Japanese patent application 200126277 (Pub. No. 2001303218 A). One exemplary composition is $Fe_{72}Al_5Ga_2P_{11}C_6B_4$. Another example is $Fe_{72}Al_7Zr_{10}Mo_5W_2B_{15}$.

TABLE 1

Exemplary amorphous alloy compositions

| Alloy | Atm % | Atm % | Atm % | Atm % | Atm % | Atm % |
|---|---|---|---|---|---|---|
| 1 | Zr 41.20% | Ti 13.80% | Cu 12.50% | Ni 10.00% | Be 22.50% | |
| 2 | Zr 44.00% | Ti 11.00% | Cu 10.00% | Ni 10.00% | Be 25.00% | |
| 3 | Zr 56.25% | Ti 11.25% | Cu 6.88% | Ni 5.63% | Nb 7.50% | Be 12.50% |
| 4 | Zr 64.75% | Ti 5.60% | Cu 14.90% | Ni 11.15% | Al 2.60% | Be 1.00% |
| 5 | Zr 52.50% | Ti 5.00% | Cu 17.90% | Ni 14.60% | Al 10.00% | |
| 6 | Zr 57.00% | Nb 5.00% | Cu 15.40% | Ni 12.60% | Al 10.00% | |
| 7 | Zr 50.75% | Cu 36.23% | Ni 4.03% | Al 9.00% | Sn 0.50% | |
| 8 | Zr 46.75% | Ti 8.25% | Cu 7.50% | Ni 10.00% | Be 27.50% | |
| 9 | Zr 21.67% | Ti 43.33% | Ni 7.50% | Be 27.50% | | |
| 10 | Zr 35.00% | Ti 30.00% | Cu 7.50% | Be 27.50% | | |
| 11 | Zr 35.00% | Ti 30.00% | Co 6.00% | Be 29.00% | | |
| 12 | Au 49.00% | Ag 5.50% | Pd 2.30% | Cu 26.90% | Si 16.30% | |
| 13 | Au 50.90% | Ag 3.00% | Pd 2.30% | Cu 27.80% | Si 16.00% | |
| 14 | Pt 57.50% | Cu 14.70% | Ni 5.30% | P 22.50% | | |
| 15 | Zr 36.60% | Ti 31.40% | Nb 7.00% | Cu 5.90% | Be 19.10% | |
| 16 | Zr 38.30% | Ti 32.90% | Nb 7.30% | Cu 6.20% | Be 15.30% | |
| 17 | Zr 39.60% | Ti 33.90% | Nb 7.60% | Cu 6.40% | Be 12.50% | |
| 18 | Cu 47.00% | Ti 34.00% | Zr 11.00% | Ni 8.00% | | |
| 19 | Zr 55.00% | Co 25.00% | Al 20.00% | | | |

The aforedescribed amorphous alloy systems can further include additional elements, such as additional transition metal elements, including Nb, Cr, V, Co. The additional elements can be present at less than or equal to about 30 wt %, such as less than or equal to about 20 wt %, such as less than or equal to about 10 wt %, such as less than or equal to about 5 wt %.

In some embodiments a composition having an amorphous alloy can include a small amount of impurities. The impurity elements can be intentionally added to modify the properties of the composition, such as improving the mechanical properties (e.g., hardness, strength, fracture mechanism, etc.) and/or improving the corrosion resistance. Alternatively, the impurities can be present as inevitable, incidental impurities, such as those obtained as a byproduct of processing and manufacturing. The impurities can be less than or equal to about 10 wt %, such as about 5 wt %, such as about 2 wt %, such as about 1 wt %, such as about 0.5 wt %, such as about 0.1 wt %. In some embodiments, these percentages can be volume percentages instead of weight percentages. In one embodiment, the composition consists essentially of the amorphous alloy (with only small incidental amount of impurities). In another embodiment, the composition consists of the amorphous alloy (with no observable trace of impurities).

Amorphous alloy systems can exhibit several desirable properties. For example, they can have a high hardness and/or hardness; a ferrous-based amorphous alloy can have particularly high yield strength and hardness. In one embodiment, an amorphous alloy can have a yield strength of about 200 ksi or higher, such as 250 ksi or higher, such as 400 ksi or higher, such as 500 ksi or higher, such as 600 ksi or higher. With respect to the hardness, in one embodiment, amorphous alloys can have a hardness value of above about 400 Vickers-100 mg, such as above about 450 Vickers-100 mg, such as above about 600 Vickers-100 mg, such as above about 800 Vickers-100 mg, such as above about 1000 Vickers-100 mg, such as above about 1100 Vickers-100 mg, such as above about 1200 Vickers-100 mg. An amorphous alloy can also have a very high elastic strain limit, such as at least about 1.2%, such as at least about 1.5%, such as at least about 1.6%, such as at least about 1.8%, such as at least about 2.0%. Amorphous alloys can also exhibit high strength-to weight ratios, particularly in the case of, for example, Ti-based and Fe-based alloys. They also can have high resistance to corrosion and high environmental durability, particularly, for example, the Zr-based and Ti-based alloys.

Characteristic Temperatures

An amorphous alloy can have several characteristic temperatures, including glass transition temperature Tg, crystallization temperature Tx, and melting temperature Tm. In some embodiments, each of Tg, Tx, and Tm, can refer to a temperature range, instead of a discrete value; thus, in some embodiments the term glass transition temperature, crystallization temperature, and melting temperature are used interchangeably with glass transition temperature range, crystallization temperature range, and melting temperature range, respectively. These temperatures are commonly known and can be measured by different techniques, one of which is Differential Scanning calorimetry (DSC), which can be carried out at a heating rate of, for example, about 20° C./min.

In one embodiment, as the temperature increases, the glass transition temperature Tg of an amorphous alloy can refer to the temperature, or temperature ranges in some embodiments, at which the amorphous alloy begins to soften and the atoms become mobile. An amorphous alloy can have a higher heat capacity above the glass transition temperature than it does below the temperature, and thus this transition can allow the identification of Tg. With increasing temperature, the amorphous alloy can reach a crystallization temperature Tx, at which crystals begin to form. As crystallization in some embodiments is generally an exothermic reaction, crystallization can be observed as a dip in a DSC curve and Tx can be determined as the minimum temperature of that dip. An exemplary Tx for a Vitreloy can be, for example, about 500° C., and that for a platinum-based amorphous alloy can be, for example, about 300° C. For other alloy systems, the Tx can be higher or lower. It is noted that at the Tx, the amorphous alloy is generally not melting or melted, as Tx is generally below Tm.

Finally, as the temperature continues to increase, at the melting temperature Tm, the melting of the crystals can begin. Melting is an endothermic reaction, wherein heat is used to melt the crystal with minimal temperature change until the crystals are melted into a liquid phase. Accordingly, a melting transition can resemble a peak on a DSC curve, and Tm can be observed as the temperature at the maximum of the peak. For an amorphous alloy, the temperature difference $\Delta T$ between Tx and Tg can be used to denote a supercritical region (i.e., a "supercritical liquid region," or a "supercritical region"), wherein at least a portion of the amorphous alloy retains and exhibits characteristics of an amorphous alloy, as opposed to a crystalline alloy. The portion can vary, including at least 40 wt %, at least 50 wt %, at least 60 wt %, at least 70 wt %, at least 80 wt %, at least 90 wt %, at least 99 wt %; or these percentages can be volume percentages instead of weight percentages.

Forming an Seal/Interfacial layer

Because of their desirable properties, amorphous alloys can be used in a variety of applications, including forming an interfacial layer on a substrate that is in intimate contact with the substrate or as a bonding element to bond more than one part together. The term "forming" can refer to shaping a composition into a desired or predetermined configuration. As will be discussed further below, forming can include, but is not limited to, thermoplastic forming, thermoplastic extrusion, thermoplastic shearing, soldering, over-molding, and overcastting. The process of forming can take place while a composition is disposed onto a desired location, such as a surface of a substrate, which can be, for example, a part of a mold.

The interfacial layer can effectively serve as a seal on the substrate. Because the thickness of the interfacial layer is generally much smaller than the dimensions of the part the layer is bonded to or disposed on, the layer can be considered in some embodiments as an interfacial layer. Thus, in some embodiments the term "interfacial layer" herein is used interchangeably with an "interfacial layer" or "interfacial layer, although the interfacial layer can have a certain thickness. For example, the thickness of the interfacial layer can be less than about 10 cm, such as less than about 5 cm, such as less than about 1 cm, such as less than about 5 mm, such as less than about 2 mm, such as less than about 1 mm, such as less than about 500 microns, such as less than about 200 microns, such as less than about 100 microns, such as less than about 50 microns, such as less than about 20 microns, such as less than about 10 microns, such as less than about 1 micron.

Alternatively, the alloys can form an interfacial layer between a plurality of parts to create an intimate seal between the two parts. In one embodiment, the seal can serve as a bonding element between the parts. More than two parts can be used, such as three parts, four parts, five parts, or more. FIG. 1 provides a flow chart of an exemplary forming process in one embodiment. Specifically, the process can include heating an at least partially amorphous composition to a first temperature that is below Tx of the composition; disposing the heated composition onto the surface of at least one part; and cooling the heated composition form an interfacial layer or seal. The composition can be a blob, have a predefined shape before making the seal, etc. For example, the composition can be disposed on a first part as a seal material, and then the second part can be brought into the seal material. Alternatively, the seal material could be pushed into cavity or void formed between two disparate parts. Yet in other embodiment, two parts could be brought into the seal material. The two parts can be preheated at the same or different temperature before making the seal.

The part(s) can serve as a substrate, and the interfacial layer can have an intimate contact with the material surface. An intimate contact can refer to being in at least substantially complete contact, such as in complete contact. Generally, such a contact refers to a lack of gap between the interfacial layer and the surface of the part/substrate. Various metrics can be used to describe the levels or degrees of complete contact. One of these is the impermeability of a fluid.

The interfacial layer, or interfacial layer, formed on a surface of a part, or several parts can create an effective seal between the surface of the part and the interfacial layer itself. In one embodiment, the interfacial layer is at least partially impermeable, such as at least substantially impermeable, such as completely impermeable to fluid, including water (i.e., "waterproof") or air (i.e., "air-tight"). The fluid can also include body fluid, such as blood, saliva, urine, or corrosive fluid, such as acidic or basic fluid, such as one that contains chloride ions. In one embodiment, the interfacial layer creates a seal that permits less than 1000 ppm, such as less than about 500 ppm, such as less than about 200 ppm, such as less than about 100 ppm, such as less than about 50 ppm, such as less than about 10 ppm, to pass through or penetrate the seal from one side of the seal to the other. The passage takes into account the passage through the seal itself and any gap present between the seal and the surface of a part (or parts).

In one embodiment wherein an interfacial layer having an amorphous alloy is formed on a part, because of the intimate contact between the interfacial layer and the part, the interfacial layer effectively forms a seal on the part. In an alternative embodiment wherein an interfacial layer is formed between two parts, the interfacial layer can form a seal between the two components. The seal can simultaneously function as a bonding element that bonds the two parts together. In one embodiment, the seal can be a hermetic seal. A hermetic seal can refer to an airtight seal that is also impermeable to fluid or micro organisms. The seal can be used to protect and maintain the proper function of the protected content inside the seal.

Parts

Depending on the application, the part or substrate, upon which an amorphous alloy composition is disposed to form an interfacial layer or seal, can be made of any material. For example, the material can include a metal, a metal alloy, a ceramic, a cermet, a polymer, or combinations thereof. The part or substrate can be of any size or geometry. For example, it can be shots, a sheet, a plate, a cylinder, a cube, a rectangular box, a sphere, an ellipsoid, a polyhedron, or an irregular shape, or anything in between. Accordingly, the surface of the part upon which the interfacial layer is formed can have any geometry, including a square, a rectangle, a circle, an ellipse, a polygon, or an irregular shape.

The part can have a recessed surface. The recessed surface can include an undercut or a cavity. The recessed surface can have a predetermined geometry. The part can be solid or hollow. In one embodiment wherein the part is hollow, such as a hollow cylinder, the recessed surface can be on the interior surface or exterior surface of the part. In other words, the interfacial layer can form on the interior surface or the exterior surface of the part. In some embodiments, the part surface can have a roughness of any desirable size to facilitate the formation of the interfacial layer. For example, the first part can be a bezel for a watch or an electronic device housing with an undercut. Alternatively, it can have at least one cavity or undercut of random size or geometry. For example, the first part can be a mold or die (e.g., for extrusion) for the composition therein, and thus the cavity refers to the cavity space of the mold or die. In another embodiment, the first part can be the outer shell of an electrical connector that has a hollow cylindrical shape.

Multiple parts can be used. In one embodiment, an interfacial layer having an amorphous alloy can create an intimate seal between the interfacial layer with a surface of a first part and simultaneously with a surface of a second part. The interfacial layer effectively can serve as a bonding element between the two parts. The surface of each or some the parts can have roughness or recessed surface (e.g., undercut or cavity).

The two parts can be vertically aligned, horizontally aligned, or not aligned. The two parts can be joined perpendicularly to each other or parallel to each other. Also, one part can be inside of the other. For example, the first part can be a hollow shape (e.g., cylinder or rectangular box) and the second part can be a wire inside the hollow space of the first part, and the interfacial layer can be formed between the two, effectively surrounding the wire and fills at least a part of the hollow space of the first part. In this embodiment, the interfacial layer can become a seal between the wire and the cylindrical part. Alternatively, the interfacial layer can be used to join two parts of the same size and/or geometry or different size and/or geometry. For example, in one embodiment, the interfacial layer can be used as to join two pieces of the housing of an electronic device, the interfacial layer simultaneously serving as a fluid-impermeable seal between the two parts.

Figure 3:
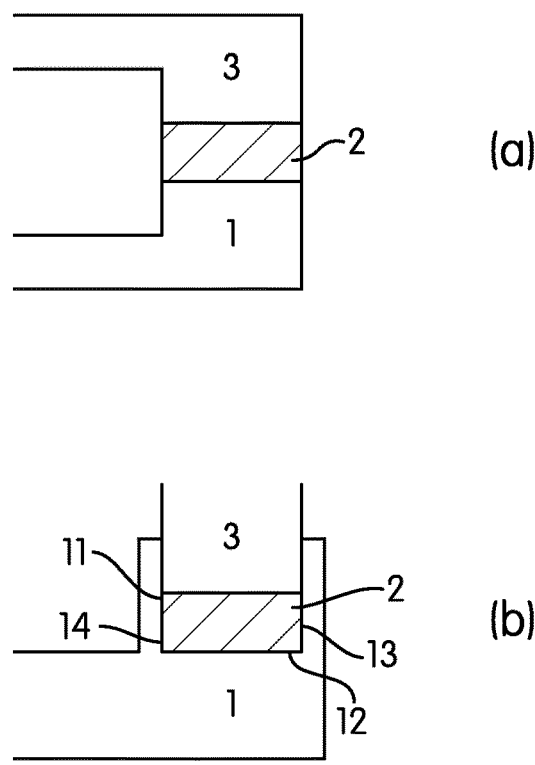
FIGS. 3(a)-3(b) provide two schematics showing two parts being joined together by an interfacial layer described in one embodiment.
Figure 5:
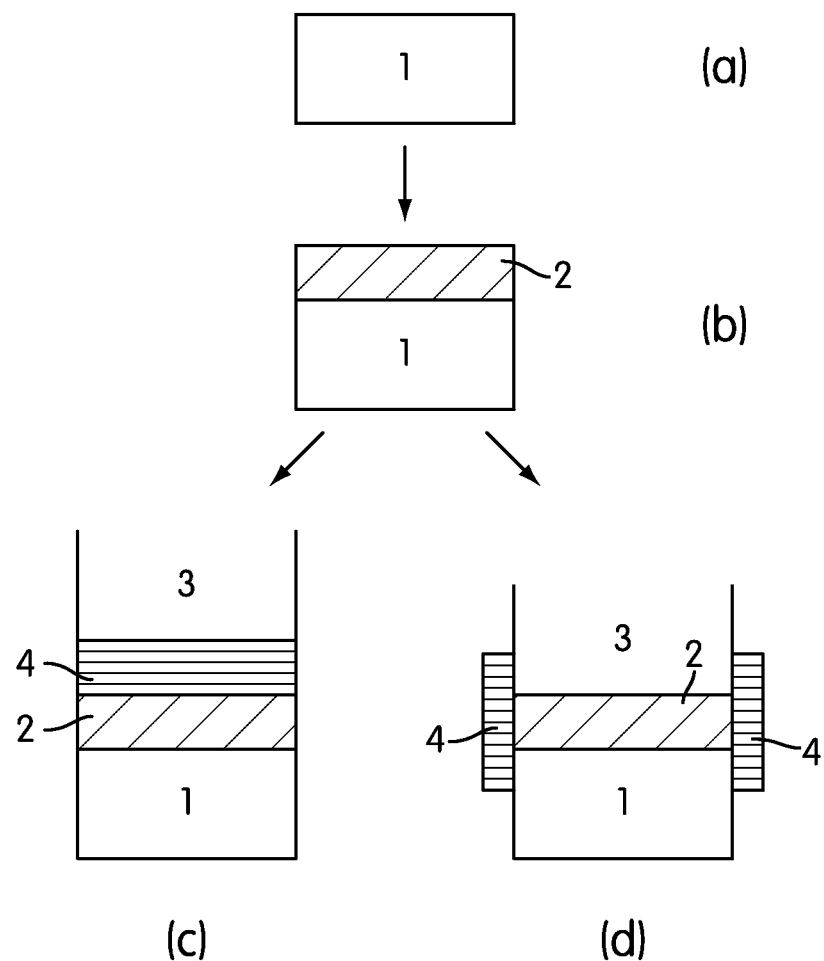
FIGS. 5(a)-5(d) provide schematics showing the process of forming two interfacial layers/seals in one embodiment.

As shown in FIGS. 3(a)-3(b), the two parts can be aligned such that the faces being bonded are of the same size and shape (FIG. 3(a)). Alternatively, one part can fit into a cavity of the other to provide, for example, an interlocking mechanism, as shown in FIG. 3(b). More than two parts can be used. For example, the interfacial layer can be used to bond the first part or a second part to a third part, a fourth part, etc. Also, more than one interfacial layer can be created and used. For example, as shown in FIGS. 5(c) and 5(d), a second interfacial layer can be used to provide bonding. In one embodiment, a third interfacial layer, a fourth, a fifth, etc., interfacial layer of seal or amorphous alloy can be used. These additional interfacial layer(s) can be located in any arrangement relative to each other. For example, they can be on one side, on both sides, on top of, at the bottom of, sandwiching one or more layer, or being sandwiched between two or more layers.

Depending on the application, the part(s) can be made of any suitable materials. For example, each or at least one of the parts can include a material that is crystalline, partially amorphous, substantially amorphous, or fully amorphous. The part(s) can have the same or different microstructure as the composition that is disposed thereon to form the interfacial layer. For example, they can be amorphous, substantially amorphous, partially amorphous, or crystalline, or they can be different. As described above, the amorphous composition of the parts can be a homogeneous amorphous alloy or a composite having an amorphous alloy. In one embodiment, the composite can include an amorphous matrix phase surrounding a crystalline phase, such as a plurality of crystals. The crystals can be in any shape, including having a dendritic shape.

The part can include an inorganic material, an organic material, or a combination thereof. The part can include a metal, a metal alloy, a ceramic, or combinations thereof. The part can also be a composite with various materials combined together or be of essentially one material. Depending on the application, in some embodiments, the part(s) can include a material that has a softening temperature higher than the $T_g$ of the composition that will be disposed thereon to form the interfacial layer. The softening temperature in the context of the part(s) can refer to the $T_g$ thereof (in the case of an amorphous material) or the melting temperature $T_m$ (in the case of a crystalline material). In the case of a mixture of amorphous material and crystalline material, the softening temperature can refer to the temperature at which the atoms in the material begin to become mobile, such as $T_g$ or a temperature between $T_g$ and $T_m$. In one embodiment, the part(s) can have a softening temperature that is higher than the crystallization temperature, or in some embodiments, the melting temperature, of the amorphous alloy of the interfacial layer. In one embodiment, the part can include a material that has a softening temperature that is above about 300° C., preferably above about 200° C., more preferably above about 100° C.; for example, the part can be used with a platinum-based alloy. In another embodiment, the part can comprise a material that has a softening temperature that is above about 500° C.; for example, the part can be used with a zirconium based alloy. The part can comprise diamond, carbide (e.g., silicon carbide), or a combination thereof.

Depending on the application, the part(s) can be a part of an electronic device or any type of part that can utilize the benefits of having the aforedescribed interfacial layer/seal. An electronic device herein can refer to a cell phone, a laptop computer, a display, a desktop computer, or combinations thereof. The applications are described in detail further below.

Compositions of Interfacial Layer or Seal

The interfacial layer, or seal, can be formed by first providing a composition that is at least partially amorphous, the composition having a glass transition temperature $T_g$ and a crystallization temperature $T_x$. The interfacial layer or seal can be formed on, for example, a portion of a recessed surface on the surface of a part. Alternatively, the interfacial layer or seal can be disposed onto the surface of a plurality of parts such that the parts can be joined or bonded with the interfacial layer. The composition can be shaped into the interfacial layer or seal as a product. In one alternative embodiment, the method of fabricating a seal or interfacial layer includes further the step(s) of making a composition that is at least partially amorphous from substantially non-amorphous feedstock such that the composition can be shaped and/or disposed onto the surface of at least one part to form an interfacial layer/seal.

The composition to be molded can be at least partially amorphous, such as at least substantially amorphous, such as completely amorphous. The references to "at least partially amorphous" and "at least substantially amorphous" are as described above. The composition can include any of the aforedescribed amorphous alloy systems. For example, the composition can include an alloy that is at least substantially amorphous, a composite having an alloy at least substantially amorphous, or a combination thereof. In one embodiment, the composition can be homogeneous with respect to amorphous alloy in that the composition can consist essentially of an amorphous alloy with some incidental impurities, or the composition can consist of the amorphous alloy. Alternatively, the composition can include a composite that includes an amorphous alloy or an alloy that is at least substantially amorphous. For example, the composite can have a matrix of an amorphous phase with a crystalline phase dispersed therein. The chemical composition of the amorphous phase and the crystalline phase in the composite can be the same or different. The crystalline phase can have a dendritic structure. In one embodiment, the composite has crystalline dendrites dispersed in an amorphous alloy matrix.

The composition before heating can be in any shape or size. For example, it can be shots, a sheet, plate, a cylinder, a cube, a rectangular box, a sphere, an ellipsoid, a polyhedron, or an irregular shape, or anything in between. In one embodiment, the composition is in a form of a plurality of particles, which can be spherical, wire-like, flake-like, sheet-like, rod-like, or anything in between. The composition can be already disposed on a portion of the surface of the substrate or separate from the surface before the heating step commences.

The amorphous phase (i.e., amorphous alloy) within the composition can be made by any suitable pre-existing method. In one embodiment, the method of making the composition as raw material can include first heating an alloy feedstock to melt the feedstock and then rapid-cool the heated feedstock to the supercooled region of the alloy such that the alloy becomes at least partially amorphous. The alloy in the feedstock can be of any type, and it can be amorphous or crystalline, or both. In one embodiment, the feedstock is at least partially amorphous, such as at least substantially amorphous, such as entirely amorphous. In another embodiment, the feedstock is substantially not amorphous, such as it is at least partially crystalline, such as at least substantially crystalline, such as it is entirely crystalline. The feedstock can also be of any size and shape. In one embodiment, the feedstock is heated to a first temperature that is above the melting temperature Tm of the alloy in the feedstock such that any crystals in the alloy can be melted. The heated and melted feedstock can then be rapid-cooled (or "quench") to a second temperature that is below the Tg of the alloy to form the aforementioned composition, which can then be heated to be disposed and/or shaped. The rate of quenching and the temperature to be heated to can be determined by convention methods, such as utilizing a Time-Temperature-crystal Transformation (TTT) diagram.

Thermal History—Heating

The composition can then be heated to a temperature that is below the crystallization temperature Tx of the composition. This heating step can function as to soften the amorphous alloy without reaching the onset of crystallization (or melting). The first temperature can be slightly below the Tg, at the Tg, or above the Tg of the composition. In other words, the composition can be heated to (1) below the supercooled region or (2) within the supercooled region. In some embodiments, the composition can also be heated to be above the supercooled region.

The composition prior to the heating step can be already on the surface of the part or can be separate from the part. In other words, the composition can be heated while being in contact with the part or not in contact. The composition is brought to or above its Tg such that the composition can be softened. Depending on the composition, the first temperature can vary, but in most embodiments it is below Tx of the composition. The composition can also have been pre-heated so that a heated step can be skipped. For example, the first temperature is also below the softening the temperature of the part(s), as described above. In one embodiment, the first temperature is less than equal to about 500° C., such as less than equal to about 400° C., such as less than equal to about 300° C.

Prior to the heating and/or disposing step, the composition and/or part can be at ambient temperature or can be pre-heated. For example, in one embodiment, at least one of (i) the composition and (ii) the mold can be preheated to an elevated temperature before the commencement of the molding step. The elevated temperature can be the aforedescribed first temperature, second temperature, or any temperature in between. In one embodiment, in addition to the composition, the surface of any or all of the parts of the mold and/or the tools that will be used during the process can also be pre-heated to a temperature, such as to the first temperature. The tools can include, for example, a plunger or an instrument used for shaping, disposing, cutting, and/or polishing, such as a blade, a knife, a scrapping instrumentation, etc.

The composition can be brought to, above, or below its Tg such that the composition can be softened. Depending on the composition, the first temperature can vary, but in most embodiments it is below the Tx of the composition. As described above, the composition can also be pre-heated so that a heating step can be skipped. For example, the first temperature of the first fluid can be of any value(s) but can be below the softening temperature of the mold as described above. In one embodiment, the first temperature is less than equal to about 500° C., such as less than equal to about 400° C., such as less than equal to about 300° C.

The heating can be localized heating, such that only the interfacial region between the part(s) and the interfacial layer is heated. For example, only the surface region of the part(s) or tools (e.g., shaping tools) is heated to the first temperature. The region can refer to the top 50 microns or more, such as 100 microns or more, such as 200 microns or more, such as 400 microns or more, such as 800 microns or more, such as 1 mm or more, such as 1.5 mm or more, such as 2 mm or more, such as 5 mm or more, such as 1 cm or more, such as 5 cm or more, such as 10 cm or more. Alternatively, at least substantially all of the interfacial layer and the entire parts and shaping tools involved can be heated to the first temperature. The heating step can be carried out by any suitable techniques, such as with a laser, inductive heating, conductive heating, flash lamp, electron discharge, or combinations thereof. The heating time can depend on the chemical composition of the alloy. For example, the heating time can be less than or equal to 250 seconds, such as less than or equal to 200 seconds, such as less than or equal to 150 seconds, such as less than or equal to 100 seconds, such as less than equal to 50 seconds.

Thermal History—Disposing/Cooling

The heated and softened composition can become viscous and thus can be disposed onto the surface of a part (or multiple parts). The composition can be disposed onto a portion of the surface. In one embodiment, wherein the surface has a recessed portion, the composition can be disposed onto the recessed surface portion. The step of heating and/or disposing can be carried out in at least partial vacuum, such as substantial vacuum, such as vacuum to prevent the composition from reacting with air. In one embodiment, the vacuum environment can be at about $10^{-2}$ torr or less, such as at about $10^{-3}$ torr or less, such as at about $10^{-4}$ torr or less. Alternatively, the step of heating and/or disposing can be carried out in an inert atmosphere, such as in argon or nitrogen.

As aforementioned, the composition prior to heating can be in contact with the surface of the part or not. Thus, in one embodiment wherein multiple parts are involved, the step of disposing can include disposing a heated composition onto the surface of the first part and subsequent brining the second part into contact with the composition, whereby the two parts are joined. Alternatively, the heated composition can be disposed onto both the first part and the second part, thereafter the two parts are brought together with the surface having the heated composition disposed thereon facing each other and thus joined together. In an alternative embodiment wherein only one part is involved, the step of disposing can refer to moving at least some of the composition already present on the surface of the part to a designated area (e.g., the recessed surface) to form an interfacial layer/seal there.

The step of disposing can further include shaping the composition in to a desired shape on the surface, and/or other further processing steps. The disposing time can depend on the chemical composition of the alloy and/or the disposing technique employed. For example, the disposing time can be less than or equal to 250 seconds, such as less than or equal to 200 seconds, such as less than or equal to 150 seconds, such as less than or equal to 100 seconds, such as less than equal to 50 seconds. In one embodiment, the step of disposing and further processing (e.g., shaping) can take place simultaneously. Alternatively, they can take place sequentially, with further processing, for example, following the disposing of the composition onto a surface.

In one embodiment, disposing, including shaping and/or forming, can be carried out with a (mechanical) shaping pressure. The pressure can be created as a result of the different techniques used to process and dispose the composition, as described below. Depending on the application, the pressure can be applied in various ways, such as a shear pressure, a tensile pressure, a compressive pressure. For example, the pressure can help pushing the soften alloy composition in a recessed surface or cavity of the part so that the composition can form to the shape of the mold as it hardens (or solidifies). In one embodiment, the viscosity of an amorphous alloy in the supercooled liquid region can vary between $10^{12}$ Pa·s at Tg down to $10^5$ Pa·s at Tx, which is generally considered the high temperature limit of the supercooled region. The amorphous alloy in the supercooled region has high stability against crystallization and can exist as a highly viscous liquid. Liquids with such viscosities can undergo substantial plastic strain under an applied pressure. In contrast to solids, the liquid amorphous alloy can deform locally, which can drastically lower the required energy for cutting and forming. Thus, in one embodiment, the step of disposing can include thermoplastic forming. Thermoplastic forming can allow the application of a large deformation to the disposed interfacial layer to facilitate shaping. The ease of cutting and forming can depend on the temperature of the alloy, the mold, and the cutting tool. As temperature is increased the viscosity is reduced, allowing for easier forming.

Several techniques can be used to provide further processing during, or after, the step of disposing. For example, the step of disposing includes shaping or forming the amorphous alloy into a desired configuration. Shaping or forming can refer to rendering the liquid/softened composition into a desired shape before or as it solidifies. In one embodiment, the step of molding further can include conforming, shearing, extrusion, over-molding, over-casting, or combinations thereof, in at least one operation. In one embodiment, the further process step can include separating the molded article from the mold and/or polishing the surface of the molded article. Any combination of these techniques during further processing can be carried out simultaneously in one step or in multiple sequential steps.

For example, conforming can be performed by applying a pressure such that the shape of the amorphous alloy composition after solidification/hardening can form to a desirable shape, such as the shape of a portion of the part(s). In other words, if the amorphous alloy composition has a first shape, and the mold alloy composition has a second shape (the second shape can be different from the first shape), conforming can allow the first shape of the pre-shaped alloy composition to alter and change into the second shape (of the mold). Furthermore, in a case of the part being a mold, conforming can include pushing the liquid/softened composition into the cavity space of the mold (or a cavity of a part) so that after cooling the resultant molded article can take the shape of the cavity of the mold.

Shearing can be applied by applying a shearing force between the interfacial layer. Shearing can be applied to facilitate moving and shaping the interfacial layer and/or to facilitate the separate of the resultant interfacial layer (after solidification) from the mold. Extrusion can be applied, for example, to further shape a solidified/cooled seal/interfacial layer into a pre-determined shape or size. Alternatively extrusion can be applied during the step of disposing so that the composition can take the shape of the extrusion die (or mold) as it is disposed into the die and thereafter solidify. Over-molding, or over-casting, can be applied, for example, to remove the excess the interfacial layer from the surface of the part or to facilitate transferring of the softening composition into the recessed surface (e.g., cavity, undercut, etc) of the part.

The disposed softened composition on the part(s) can then be cooled to harden or solidify. The cooling time can depend on the chemical composition of the alloy. During the cooling step, the pressure applied during the disposing step can be maintained. The pressure can be decreased, the same, or increased relative to that used in the disposing step. Accordingly, in one embodiment, with the aid of the applied pressure, the interfacial layer can continue to be shaped during the cooling step. For example, the cooling time can be less than or equal to 250 seconds, such as less than or equal to 200 seconds, such as less than or equal to 150 seconds, such as less than or equal to 100 seconds, such as less than equal to 50 seconds. The cooling step can be carried out at rates different from or similar to the heating rates at the heating step. The cooling rate can be carried out at a rate higher than, lower than, or the same as, the heating rate at the heating step.

In one embodiment, further processing steps can be applied to the interfacial layer after the cooling step is completed or during cooling. For example, over-molding can be applied to scrap off or trim excess materials of the resultant interfacial layer; for example, the excess can be the portion protruding out of the cavity or undercut of the part(s). Additional steps such as separating the seal and/or part by mechanical force, such as shear force, can be applied to separate the products, including the interfacial layer/seal, from the mold or some parts. In one embodiment, addition steps of cutting the interfacial layer and/or the part(s) it is in contact with into desired size and geometry can be applied. The cutting step can be carried out, for example, with a heated blade. I one embodiment, during cutting, only the blade is heated, or both the blade and the interfacial layer to be cut are heated by any of the aforedescribed methods.

Figure 2:
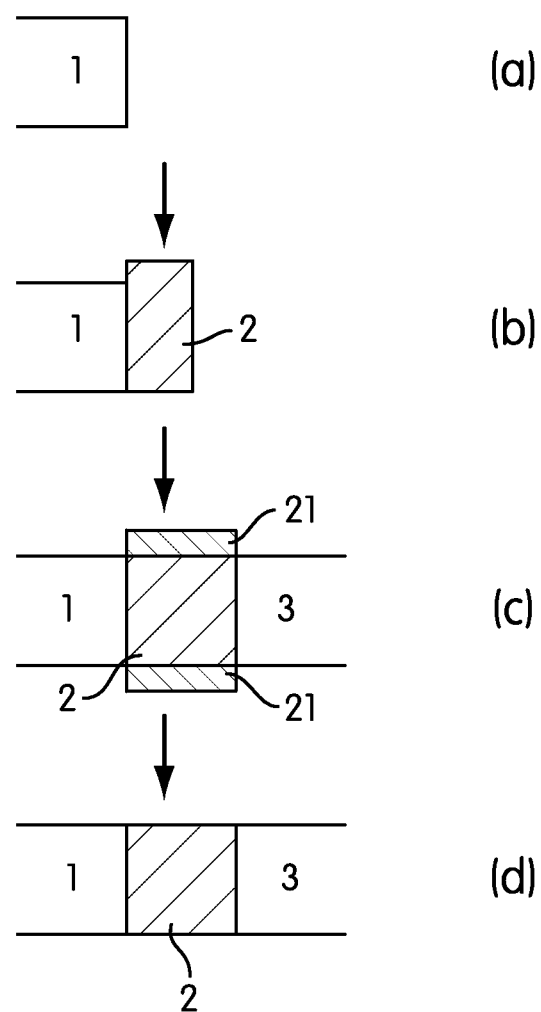
FIGS. 2(a)-2(d) provide schematics showing the process of forming an interfacial layer/seal between two parts in one embodiment. The process including disposing an composition on a first part (FIGS. 2(a)-2(b)) to form an interfacial layer and further processing of the interfacial layer to remove excess thereof (FIG. 2(c)) to reach a final configuration (FIG. 2(d)).

FIG. 2 provides a schematic of an exemplary embodiment of a process of making a seal/interfacial layer between two parts. FIG. 2(a) shows a first part 1. FIG. 2(b) shows an interfacial layer 2 comprising an alloy that is at least partially amorphous disposed on a portion of the a surface of the part 1. The interfacial layer 2 can also be disposed onto a surface of a second part 3, as shown on FIG. 2(c). The disposing onto the second part 3 can be achieved by disposing the composition directly onto the second part 3, or bring the second part 3 into contact with the composition that is already disposed on the first part 1. As shown in FIG. 2(c), the interfacial layer/seal has an excess portion 21, which can be removed by a further process step, such as over-molding to mechanically scrap the excess 21 of the interfacial layer 2 and level the interfacial layer 2 with the two parts 1 and 3. The final product is shown in FIG. 2(d). It is noted that the figures provided in this application are illustrative, and any of them can be rotated 90-degrees. Specifically, while the parts and the interfacial layer are arranged in a horizontal configuration, they can be arranged in a vertical configuration, with the second part 3 over the interfacial layer 2, which is over the first part 1, or in a reverse order.

It is noted that because the amorphous composition should not have acquired any crystalline phase in most embodiments, the cooling need not be as fast as that needed to make an amorphous alloy. The composition can be cooled to below the Tg of the composition, such as finally to the ambient temperature. The resultant cooled composition is at least partially amorphous, such as at least substantially amorphous, such as completely amorphous. In one embodiment where there are two metal parts, the amorphous alloy interfacial layer can create a mechanical interlock between the two metal parts, with little inter-diffusion of the metal species from the parts into the interfacial layer.

In some embodiments, the heating history of an amorphous alloy can be cumulative. Thus, the steps of heating, disposing, and cooling can be repeated many times, as long as the total heating time in the heating history is less than that would trigger crystal formation. This can provide an unexpected benefit of having the ability to reshape, remold, and/or re-bond the interfacial layer and the parts.

Forming the Interfacial Layer or Seal

The interfacial layer or seal comprising the amorphous alloy as a result of the aforedescribed methods can have several desirable properties. At the outset, as aforedescribed, the cooled interfacial layer/seal retain at least partially amorphous phase of the alloy composition before the heating step. In one embodiment, the seal/interfacial layer is at least substantially amorphous, such as completely amorphous.

In one embodiment, the interfacial layer or seal can function as a bond between two (or more) parts. For examples, it can exhibit any of the properties (e.g., mechanical, chemical, etc) aforedescribed with respect to the amorphous alloys. In one embodiment, the interfacial layer/seal has substantially the same microstructure as the part(s) or tools used to form the interfacial layer/seal. For example, the mold, or any of the tools used during the method can have the same microstructure as the interfacial layer/seal. In one embodiment, the interfacial layer/seal and the tools and parts are substantially amorphous, such as entirely amorphous. Accordingly, in one embodiment, at least one dimension of the cooled interfacial layer/seal is greater than the critical (casting) thickness of the alloy composition. The thickness of the interfacial layer/seal can be any of the value aforedescribed. The thickness can increase if more than one interfacial layer is formed. For example, a second or third layer can be formed over or below the seal/interfacial layer, or these additional layers can be formed on the side thereof, as shown in FIGS. 5(c)-5(d).

The interfacial layer can also have a near net shape. A "near net-shape" herein refers to a substantially similar geometry to the final geometry of the final product. In one embodiment, this near net shape property of the property can provide an unexpected advantage of needing minimal post-processing.

The presently described methods allow the bonds made of the amorphous apply composition to be formed at a lower temperature than convention methods such as soldering or braising. Also, the presently described methods surprisingly can allow the fabrication of an interfacial layer or seal to be made with very small volume shrinkage during the cooling step; this is in stark contrast to the convention bonding method such as braising. In one embodiment, the volume shrinkage (of the formed interfacial layer/seal relative to the composite disposed onto the surface of a part) can be less than about 1%, such as less than about 0.8%, such as less than about 0.6%, such as less than about 0.5%, such as less than about 0.3%, such as less than about 0.2%, such as less than about 0.1%, such as less than about 0.09%. Such a small volume shrinkage can allow an intimate contact between the interfacial layer or seal and the part(s); as a result, the seal can be impermeable to fluid, as described above.

The presently described interfacial layer/seal can also improve the quality of sealing, bonding, and the fastening of the interfacial layer-part assembly, as compared to conventional seal, which often exhibits a certain amount of leakage, be it through the seal or at the interfacial layer between the seal and a structural component it is bonded to. For example, the interfacial layer can be in intimate contact with the surface of each of the parts (and each of their surfaces) it is in contact with. As aforedescribed, the contact of the presently described interfacial layer/seal can be substantial, or complete contact. In one embodiment where there are two parts, the interfacial layer forms an effective seal between the two parts. One additional advantage of using the amorphous alloy as a seal, as opposed conventional braising or soldering processes, is that the amorphous alloy while being shaped does not chemically attack or corrode the surface of the parts. In other words, there is minimal inter-diffusion of the chemical species or elements between the part and the interfacial layer. In one embodiment, presently described methods and the interfacial layer/seal formed do not permit the elements of the part(s) from dissolving and/or diffusing into the interfacial layer/seal formed. As a result, the resultant interfacial layer/seal is substantially free of the elements from the part it is in contact with, unless the element is a common element already present in the alloy composition in the interfacial layer before the step of disposing.

The seal-part assembly can take many forms. For example, one embodiment provides an article, including a first part having a first surface and a seal, such as a hermetic seal, disposed over a portion of the first surface, wherein the seal includes a composition that is at least partially amorphous. As aforedescribed, the part can be solid or hollow, and thus the first surface can be at the interior of the first part or can be at the exterior of the first part. The composition can be any of the aforedescribed compositions, with the desirable properties thereof. In one embodiment, the seal can have at least one dimension that is greater than the critical casting thickness of the amorphous alloy composition.

The assembly can, for example, take the form as illustrated in FIG. 3(a)-3(b). As illustrated in FIG. 3(a), the interfacial layer 2 is formed and serves as a bonding element between parts 1 and 3. The parts can be, for example, two pieces of a housing of an electronic device. The two parts need not be aligned. For example as shown in FIG. 3(b), the first part can have a recessed surface (i.e., cavity) 11, and the interfacial layer 2 is introduced into the cavity 11 and is bonded to the second part 3, which fits into the cavity of the first part. The interfacial layer 2 can be deposited on the surface 12 at the bottom of the cavity or can be on the surface 12 or 14 on the sides of the cavity. Thus, the second part 3 can be bonded to the first par 1 at any of the surfaces 12, 13, and 14, or combinations thereof, via the interfacial layer 2. In the case where the cavity is a circular in shape (i.e., no plurality of distinct sides), the interface layer can be disposed over a surface at the bottom of the cavity 11 in part 1 or around the part 3, including the bottom, when part 3 is inserted into the cavity 11 of part 1, providing a circumferential seal around a portion of the part 3 in the cavity 11.

Figure 4:
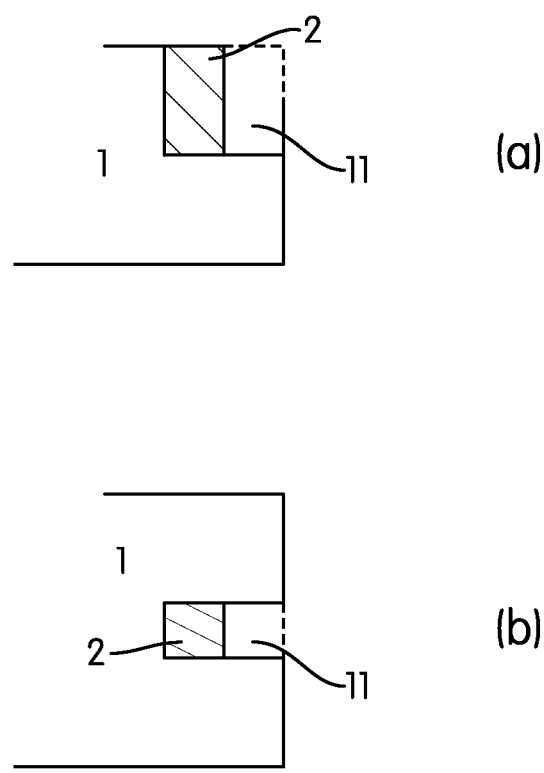
FIGS. 4(a)-4(b) provides two schematics showing a seal can being formed on a recessed surface of a part.

Alternatively, the interfacial layer is used to form a seal or interfacial layer over only a part, instead of being used to bond two parts. As shown in FIGS. 4(a)-4(b), the interfacial layer 2 can be formed on a recessed surface (or cavity or undercut, depending on the situation). The interfacial layer can be formed to fill partially the cavity, substantially the entire cavity, or the entire cavity. In a three-dimensional diagram of FIGS. 4(a) and 4(b), the seal can for example, surround the entire circumference of the first part 1 or surround a part of the circumference of the first part 1, depending on the configuration of the cavity of the recessed surface.

As aforedescribed, the process of forming an interfacial layer can be repeated multiple times. This can allow reshaping and reforming the interfacial layer between the parts or over a part. In one embodiment, the repeated process can be used to form more than one interfacial layer. FIGS. 5(a)-5(d) illustrates such a process. As described above, an interfacial layer 2 can be disposed on, or formed over, the surface of the first part 1, as shown in FIGS. 5(a)-5(b). Before contacting the interfacial layer with the second part 3, a second interfacial layer/seal 4 layer can be formed, the second interfacial layer/seal 4 being in touch with at least a portion of the first interfacial layer 2; see FIG. 5(c)-5(d). This second, additional interfacial layer 4 can have the same chemical composition and microstructure as the first interfacial layer 2, or it can have different chemical composition and/or microstructure as the interfacial layer 2. In one embodiment, the second interfacial layer 4 can include a composition that is at least partially amorphous, such as substantially amorphous, such as completely amorphous. In one embodiment, the first interfacial layer 2 can be a part of a seal, such as a hermetic seal, and thus the second interfacial layer can act as an additional interfacial layer or seal.

The second part 3 can then be brought into contact with the second interfacial layer 4; or alternatively, some of the second layer 4 can be disposed onto the second part 3 and the two parts 1 and 3 are brought together so that an overall second layer 4 is formed. In one embodiment, the first interfacial layer 2 is sandwiched between the first part 1 and the second part 3, serving as a bonding element therebetween. See FIG. 5(c). Alternatively, the second interfacial layer 4 need not be disposed over the first interfacial layer 2. For example, the second seal/interfacial layer can also be disposed on the side that is perpendicular to the first interfacial layer 2. In other words, in this embodiment, the second interfacial layer/seal can provide a seal in another direction. The second layer 4 can be on one side or both sides of the first interfacial layer 2, and the second interfacial layer 4 can further be contact with the first part 1, the second part 3, or both. In one embodiment, the second interfacial layer 4 forms a ring around the first part-first interlayer-send assembly. The contact can also refer to electrical contact. Alternatively, the contact can refer to intimate contact, as aforementioned.

Alternative Method of Forming the Interfacial Layer or Seal

Figure 6:
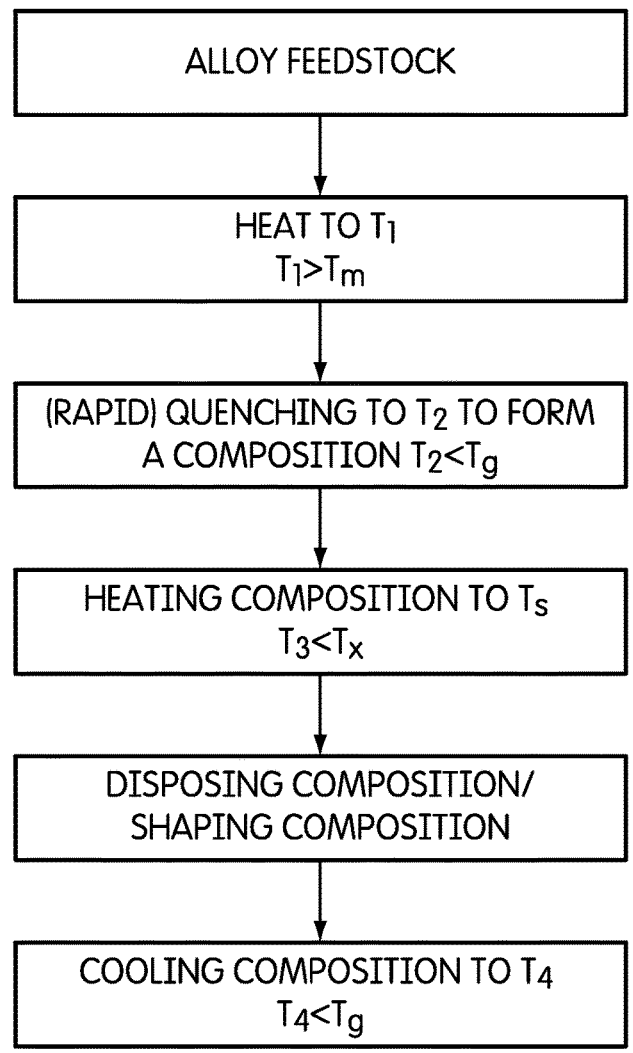
FIG. 6 provides an illustrative flow diagram showing the process of forming an interfacial layer/seal in one embodiment, the process including a step of making the amorphous alloy composition to be shaped.

Another exemplary method of forming an interfacial layer/seal further includes the step(s) of forming an amorphous alloy composition serving as a raw material before being heated to be shaped/disposed onto part(s). The additional steps can include (1) providing an alloy feedstock; heating the feedstock to a first temperature above a melting temperature Tm of the feedstock; and (3) quenching the heated feedstock to a second temperature below a glass transition temperature Tg of the feedstock to form a composition of the alloy, which composition is at least partially amorphous. The formed composition can then undergo the aforedescribed methods to be shaped into an interfacial layer/layer. An embodiment of forming an interfacial layer that includes a step of making amorphous composition is illustrated in FIG. 6. The final interfacial layer/seal may have at least one dimension that is greater than the critical casting thickness thereof.

The feedstock in this embodiment need not be amorphous. In one embodiment, the feedstock is at least partially crystalline, such as at least substantially crystalline, such as completely crystalline. The feedstock can be in any shape or form. For example, it can be sheet-like, flak-like, rod-like, wire-like, particle-like, or anything in between. The techniques of making amorphous alloy from crystalline alloys are known, and any of the known methods can be employed hereinto to fabricate the composition. Although different examples of method of forming are described here, other similar forming processes or combinations of such can also be used. For example, the TTT diagram can be utilized to determine a suitable cooling rate and/or a temperature to heat the feedstock to before the feedstock is quenched. The provided sheets, shot, or any shape feedstock can have a small critical casting thickness, but the final part can have thickness that is either thinner or thicker than the critical casting thickness.

Forming Hermetic Seal

Figure 7:
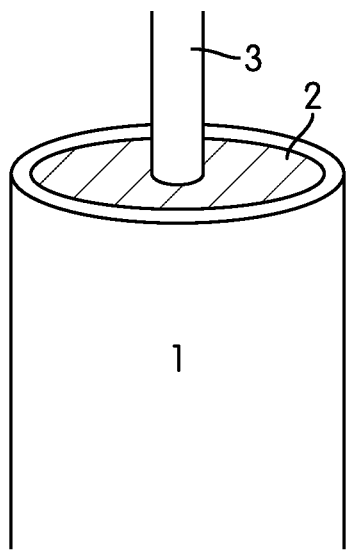
FIG. 7 provides a schematic showing an embodiment of the interfacial layer in the form of a seal between a protruding wire in a hollow cylinder.

An alternative embodiment provides an article, including a first part comprising having a cavity having a first surface; a second part at least partially located in a space in the cavity, the second part having a second surface at its exterior; and a hermetic seal in contact with a portion of the first surface and t a portion of the second surface. The second part can be, for example, a wire comprising a metal; the first part can be, for example, a hollow cylinder and comprises a metal oxide, such as an aluminum oxide. FIG. 7 provides such an embodiment, with the first part 1 being the hollow cylinder, the second part 3 being the wire, and the interfacial layer/seal 2 forming in between. The seal can have any of the aforedescribed compositions. In one embodiment, at least a portion of the second part (e.g., metal wire) can protrude out the cavity of the first part (e.g., metal oxide cylinder). In one embodiment, the seal can be a hermetic seal, the seal having an ultimate elastic strain of greater than or equal to about 1.2%, such as greater than or equal to about 1.5%, such as greater than or equal to about 2.0%. The hermetic seal can also be a seal between two pieces of the housing of an electronic device, such as two pieces of the housing of a cell phone, a computer, a display, etc. The seal can also be in intimate contact with more than just one part; for example, a portion of the seal can be in intimate contact with a second part, a third part, etc, forming an effective seal among all of these parts.

Another embodiment provides an article, including a first part having a first recessed surface and a hermetic seal disposed over the first surface, wherein the hermetic seal is formed by any of the foregoing methods. The recessed surface can be, for example, an undercut or a cavity. The method can include, for example, providing a composition that is at least partially amorphous, the composition having a glass transition temperature Tg and a crystallization temperature Tx; providing the first part having at least the first recessed surface; heating the composition to a first temperature that is below Tx; disposing the heated composition onto a portion of the first recessed surface to form a sealing layer thereon; cooling the sealing layer to a second temperature that is below Tg to form a hermetic seal over the first part. As aforementioned, the steps of heating, disposing, and cooling can be repeated as long as no crystals are formed. In one embodiment, the composition consists essentially of an alloy that is amorphous.

Using amorphous alloy to form a seal, such as a hermetic seal, can have several surprising advantages over conventional methods. Because BMG do not need to be subsequently treated to obtain optimal properties, forming a hermetic seal using conventional machining of BMG can be challenging. Additionally, the temperatures required to melt and cast bulk solidifying alloys tend to wear the mold cavity so quickly that obtaining a good uniform tolerance for a hermetic seal on final parts can be a challenge. This is particularly true for smaller and more intricate parts. The high casting temperature of a conventional method also poses a challenge for assembly when a bulk amorphous alloy is overcast and mated with a temperature sensitive component. Furthermore, the critical casting thickness of bulk amorphous alloys limits the thickness dimension of the final part. The presently described methods described overcome these challenges.

For example, as a result of the forming method aforedescribed, minimal diffusion of elements from the parts occurs. Thus, the seal is substantially free of any elements diffused from the part(s), such as entirely free of any elements diffused from the part(s). This can have the benefit of avoiding contamination of the interfacial layer and/or erosion f the part surface(s). In the case of the interfacial layer sharing some common elements with the part(s), this lack of diffusion refers to the diffusion of the elements from the part(s), as opposed to the presence of the common elements already present in the interfacial layer.

Applications of Embodiments

Because of the intimate contact provide by the interfacial layer and seal, the interfacial layer and seal can be used for a variety of applications. The interfacial layer/alloy can function as solder mass, case sealing, electrical lead for air tight or water-proof application, rivet, bonding, fastening parts together. For example, in one embodiment wherein a seal having amorphous alloy is formed between a metal-containing wire that is protruding out of a hollow cylinder, the seal can provide a water-proof and air-tight seal. Such a seal can be a hermetic seal. Also, the aforedescribed wire and cylinder assembly can be a part of various devices. For example, it can be a part of a bio-implant. For example, in the case of a Cochlear implant, the seal used for water/air tight seal and electrical/signal conductor. Alternatively, the seal can be used to seal a diamond window in analytical equipment. In another embodiment, the seal is a part of an electrical connector, with the first hollow part, for example, being the outer shell thereof.

Alternatively, it can be a part of an electronic device, such as, for example, a part of the housing of the device or an electrical interconnector thereof. For example, in one embodiment, the interfacial layer or seal can be used to connect and bond two parts of the housing of an electronic device and create a seal that is impermeable to fluid, effectively rendering the device water proof and air tight such that fluid cannot enter the interior of the device.

An electronic device herein can refer to any electronic device known in the art. For example, it can be a telephone, such as a cell phone, and a land-line phone, or any communication devices, such as a smart phone, including, for example an iPhone™, and an electronic email sending/receiving device. It can be a part of a display, such as a digital display, a TV monitor, an electronic-book reader, a portable web-browser (e.g., iPad™), and a computer monitor. It can also be an entertainment device, including portable DVD player, conventional DVD player, Blue-Ray disk player, video game console, music player, such as a portable music player (e.g., iPod™), etc. It can also be a part of a device that provides control, such as controlling the streaming of images, videos, sounds (e.g., Apple TV™), or it can be a remote control for an electronic device. It can be a part of a computer or its accessories, such as the hard driver tower housing or casing, laptop housing, laptop keyboard, laptop track pad, desktop keyboard, mouse, and speaker. The seal can also be applied to device such as a watch or a clock.

All publications, patents, and patent applications cited in this application are hereby incorporated by reference in their entirety.

What is claimed:

1. An article, comprising:
   a first part having a first surface;
   a second part having a second surface; and
   a hermetic seal comprising a bulk-solidifying amorphous alloy in contact with at least a portion of the first surface and at least a portion of the second surface;
   the hermetic seal including an airtight and waterproof seal and having a thickness that is greater than a critical casting thickness of the bulk-solidifying amorphous alloy;
   wherein the hermetic seal is formed by cooling the bulk-solidifying amorphous alloy from a temperature above a glass transition temperature Tg of the bulk-solidifying amorphous alloy to bond the bulk-solidifying amorphous alloy to the first and the second surfaces, thereby fastening the first part to the second part.

2. The article of claim 1, wherein the first surface defines an interior surface of the first part.

3. The article of claim 1, wherein the first surface defines an exterior surface of the first part.

4. The article of claim 1, wherein the bulk-solidifying amorphous alloy comprises an alloy that is at least substantially amorphous, a composite comprising an amorphous alloy, or a combination thereof.

5. The article of claim 1, wherein the bulk-solidifying amorphous alloy comprises Zr, Hf, Ti, Cu, Ni, Pt, Pd, Fe, Mg, Au, La, Ag, Al, Mo, Nb, or combinations thereof.

6. The article of claim 1, wherein the bulk-solidifying amorphous alloy is substantially free of nickel, aluminum, or beryllium, or combinations thereof.

7. The article of claim 1, wherein the seal does not permit diffusion of the elements from the first part or the second part.

8. The article of claim 1, wherein the seal and the first part have substantially the same microstructure.

9. The article of claim 1, further comprising an interfacial layer in contact with the hermetic seal, the interfacial layer comprises a material that is at least partially amorphous.

10. The article of claim 1, wherein:
the first part and the second part define an internal volume of the article; and
the hermetic seal prevents ingress of fluid into the internal volume.

11. The article of claim 1, wherein:
the first surface defines a bottom surface of a cavity in the first part;
a portion of the second part including the second surface is disposed at least partially in the cavity; and
the hermetic seal is disposed in the cavity between the first and second surfaces.

12. The article of claim 1, wherein pressure is applied to the bulk-solidifying amorphous alloy during formation of the hermetic seal.

13. An article, comprising:
a first part comprising a cavity defined by one or more sidewalls and a bottom surface;
a second part at least partially located in a space in the cavity, the second part having a coupling surface; and
a hermetic seal comprising a bulk-solidifying amorphous alloy bonded to the bottom surface and the coupling surface, thereby fastening the first part to the second part, wherein the hermetic seal is bonded to the bottom surface and the coupling surface by cooling the bulk-solidifying amorphous alloy from a temperature above a glass transition temperature Tg of the bulk-solidifying amorphous alloy to a temperature below Tg when the bulk-solidifying amorphous alloy is in contact with at least a portion of the bottom surface and at least a portion of the coupling surface;
the hermetic seal including a waterproof and airtight seal and having a thickness that is greater than a critical casting thickness of the bulk-solidifying amorphous alloy.

14. The article of claim 13, wherein at least a portion of the second part protrudes out of the cavity of the first part.

15. The article of claim 13, wherein at least one of the first part and the second part comprises a material with a softening temperature greater than or equal to at least 100° C.

16. The article of claim 13, wherein the hermetic seal has an ultimate elastic strain of greater than about 1.5%.

17. The article of claim 13, wherein the hermetic seal has an ultimate elastic strain of greater than about 2.0%.

18. The article of claim 13, wherein the coupling surface of the second part faces the bottom surface but does not face the one or more sidewalls.

19. The article of claim 13, wherein
bonding the hermetic seal to the bottom surface and to the coupling surface includes heating the bulk-solidifying amorphous alloy to the temperature above Tg, and
the heating and cooling of the bulk-solidifying amorphous alloy results in the hermetic seal having a substantially amorphous microstructure.

20. An article, comprising a first part having a first surface defining a base of a cavity and a hermetic seal comprising a bulk-solidifying amorphous alloy disposed on the first surface, wherein the hermetic seal includes an airtight and waterproof seal, has a thickness that is greater than a critical casting thickness of the bulk-solidifying amorphous alloy, and is formed by the method comprising:
heating a composition that is at least partially amorphous to a first temperature that is above a glass transition temperature Tg of the composition and below a crystallization temperature Tx of the composition;
disposing the heated composition onto at least a portion of the first surface;
disposing a second part at least partially within the cavity such that a second surface of the second part contacts the heated composition;
cooling the heated composition below Tg, thereby bonding the composition to the first surface and to the second surface and producing an at least partially amorphous microstructure in the hermetic seal.

21. The article of claim 20, wherein the composition comprises a microstructure comprising dendritic crystals.

* * * * *